United States Patent [19]

Segawa et al.

[11] Patent Number: 4,913,557

[45] Date of Patent: Apr. 3, 1990

[54] INTERGRATED LOGIC CIRCUIT HAVING TESTING FUNCTION CIRCUIT FORMED INTEGRALLY THEREWITH

[75] Inventors: Hiroshi Segawa; Hideyuki Terane, both of Hyogo, Japan

[73] Assignee: Mitsubishi Denki Kabushiki Kaisha, Tokyo, Japan

[21] Appl. No.: 271,488

[22] Filed: Nov. 15, 1988

[30] Foreign Application Priority Data

Nov. 17, 1987 [JP] Japan .................. 62-291344

[51] Int. Cl.[4] ........................................... G01K 31/28
[52] U.S. Cl. ..................... 371/22.3; 371/15.1
[58] Field of Search ................ 324/73 R, 73 AT; 371/22.1, 22.3, 22.4, 22.5, 22.6, 25.1, 15.1, 25, 15

[56] References Cited

U.S. PATENT DOCUMENTS

| | | | |
|---|---|---|---|
| 4,317,200 | 10/1979 | Wakatsuki et al. | 371/25 |
| 4,503,386 | 4/1982 | DasGupta et al. | 324/73 R |
| 4,513,418 | 11/1982 | Bardell, Jr. et al. | 371/25 |
| 4,519,078 | 9/1982 | Komonytsky | 371/25 |
| 4,553,236 | 7/1984 | Zasio et al. | 371/15 |
| 4,597,042 | 9/1983 | d'Angeac et al. | 364/200 |
| 4,680,733 | 7/1987 | Dufdrestel | 371/25 X |
| 4,697,267 | 11/1985 | Wakai | 371/25 |
| 4,698,588 | 10/1985 | Hwang et al. | 324/73 R |
| 4,701,921 | 10/1987 | Powell | 371/25 |
| 4,701,922 | 10/1987 | Kuboki | 371/25 |
| 4,710,931 | 12/1987 | Bellay | 371/25 |
| 4,710,933 | 12/1987 | Powell | 371/25 |
| 4,728,883 | 3/1985 | Green | 324/73 R |
| 4,764,926 | 12/1985 | Knight et al. | 371/25 |
| 4,780,666 | 8/1987 | Sakashita et al. | 324/73 R |

FOREIGN PATENT DOCUMENTS

56-74668  11/1979  Japan .

OTHER PUBLICATIONS

C. Mead and L. Conway "Introduction to VLSI Systems" (1980); 66, 67.
C. Mead and L. Conway "Introduction to VLSI Systems": (1980): 102, 109.
F. Tsui "LSI/VLSI Testability Design", Chapter 5 Latch Scanning Arrangements (LSA) (1986):102, 109.

Primary Examiner—Jerry Smith
Assistant Examiner—Robert W. Beausoliel
Attorney, Agent, or Firm—Lowe, Price, LeBlanc, Becker & Shur

[57] ABSTRACT

A plurality of testing circuits formed of parallel registers are incorporated in a plurality of circuit portions constituting a data processing circuit, the circuit portions having different number of bits to be processed. Each parallel register comprises scan latch circuits and latch circuits. The sum of the number of the scan latch circuits and that of the latch circuits being equal to the number of output terminals of the circuit portion having maximum number of bits to be processed. Each scan latch circuit has a first input terminal connected to an output terminal of the corresponding circuit portion, a second input terminal connected to the input terminal of the circuit portion, and an output terminal connected to the input terminal of another circuit portion, respectively. The control terminals are connected together in each register to receive control signals. Meanwhile, the latch circuit has its input terminal connected to the output terminal of the scan latch circuit in the preceding stage, and its output terminal connected to the input terminal of the latch circuit of the succeeding stage. The testing circuits function for testing the circuit portion or for the operation in accordance with the control signal inputted thereto corresponding to the test mode or the operation mode.

9 Claims, 6 Drawing Sheets

INTERGRATED LOGIC CIRCUIT HAVING TESTING FUNCTION CIRCUIT FORMED INTEGRALLY THEREWITH

CROSS-REFERENCE TO RELATED, COPENDING APPLICATION

A related copending application of particular interest to the present invention is U.S. Ser. No. 195,636 entitled "Circuit Device Having a Self-Testing Function and a Testing Method Thereof" filed on May 17, 1988.

A related copending application, of particular interest to the present invention 271,487 U.S. Ser. No. is 271,487 entitled "Circuit Having Testing Function Circuit" filed on Nov. 15, 1988.

BACKGROUND OF THE INVENTION

1. Field of the Invention

The present invention relates to circuits having testing function circuits and, more specifically, to a circuit incorporating a testing circuit for testing each of the circuit portions constituting a data processing circuit.

2. Description of the Prior Art

As the design of circuits such as LSI becomes more and more complicated, the testing thereof also becomes complicated. Sometimes a test circuit is incorporated between circuit portions constituting the circuit so as to enable appropriate testing of each the of circuit portions one by one.

Figure 1:
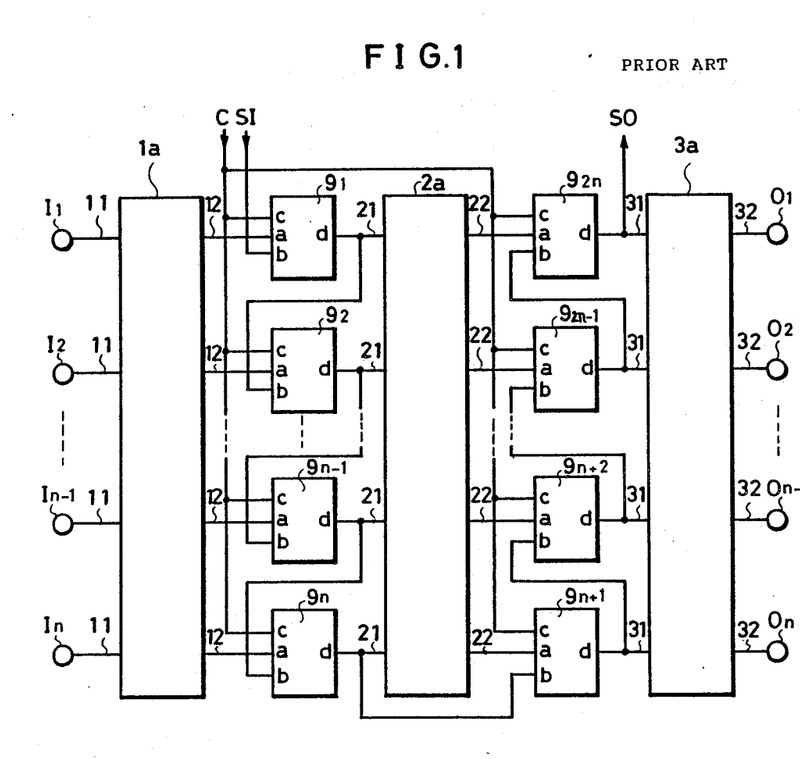
FIG. 1 is a schematic diagram of a conventional scan register type circuit having testing function.

FIG. 1 is a conventional testing circuit of scan register type incorporated between circuit portions for testing each of the circuit portions.

In testing, the testing circuit inputs test data to a desired circuit portion, and outputs data processed by the exact portion to verify the output data. When it does not test the circuit portion, the whole circuit constituted by a plurality of circuit portions operates normally.

Referring to the figure, the circuit portions $1a$, $2a$, and $3a$ constituting the circuit are, for example, combinational logic circuits having n input terminals 11, 21 and 31 and n output terminals 12, 22 and 32, respectively.

The testing circuit comprises n scan latch circuits $9_1 \sim 9_n$ arranged between the first circuit portion $1a$ and the second circuit portion $2a$, and n scan latch circuits $9_{n+1} \sim 9_{2n}$ arranged between the second circuit portion $2a$ and the third circuit portion $3a$. Each of the scan latch circuits $9_1 \sim 9_{2n}$ has a first input terminal a, a second input terminal b, a control terminal c and an output terminal d. A signal inputted to the first input terminal a or a signal inputted to the second input terminal b is selectively outputted to the output terminal d in correspondence with a control signal C inputted to the control terminal c.

Figure 2:
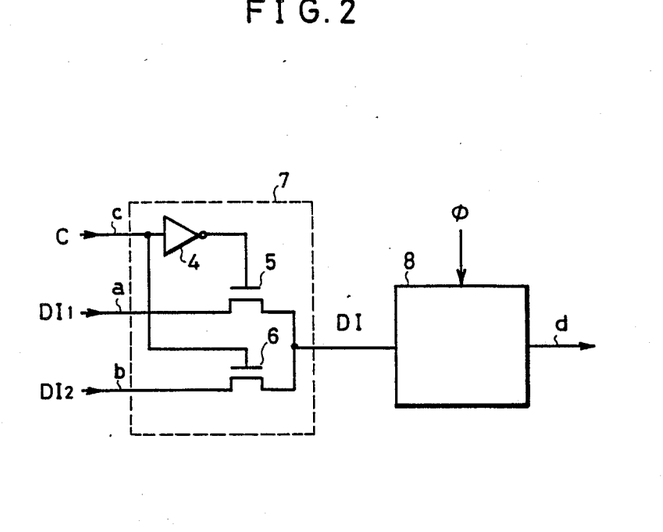
FIG. 2 is a schematic diagram showing the structure of a general scan latch circuit.

FIG. 2 is a schematic diagram showing a structure of a general scan latch circuit, which is applied to the scan latch circuits $9_1 \sim 9_n$ of FIG. 1.

The scan latch circuit is constituted by a multiplexer 7 comprising an inverter 4 and two transmission gates 5 and 6, and a latch circuit 8. In the multiplexer 7, when the control signal C inputted to the control terminal c is at "L" level, the transmission gate 5 is on and the transmission gate 6 is off. Consequently, the signal $DI_1$ inputted to the first input terminal a is transferred to the latch circuit 8. Meanwhile, when the control signal C is at "H" level, the transmission gate 5 is off and the transmission gate 6 is on. Consequently, the signal $DI_2$ inputted to the second input terminal b is transferred to the latch circuit 8.

The latch circuit 8 is a master-slave type latch circuit in synchronization with a clock signal $\phi$ which takes in the data DI from the multiplexer 7 when the clock signal $\phi$ is at the "H" level and outputs and holds the data DI when the clock signal $\phi$ is at the "L" level. Namely, the scan latch circuit takes in the signal $DI_1$ inputted to the first input terminal a when the control signal C is at the "L" level. When the control signal C is at the "H" level, it takes in the signal $DI_2$ inputted to the first input terminal b.

In FIG. 1, the first input terminals a of the scan latch circuits $9_1 \sim 9_n$ of the first to n th stages are respectively connected to the output terminals 12 of the first circuit portion $1a$. The output terminals d are connected to the input terminals 21 of the second circuit portion $2a$ and to the second input terminals b of the scan latch circuits $9_2 \sim 9_{n+1}$ of the succeeding stage, respectively.

The first input terminals a of the scan latch circuits $9_{n+1} \sim 9_{2n}$ of the (n+1)th to 2n th stages are respectively connected to output terminals 22 of the second circuit portion $2a$. The output terminals d are respectively connected to input terminals 31 of third circuit portion $3a$. The output terminals d of the scan latch circuits $9_{n+1} \sim 9_{2n-1}$ of the (n+1)th $\sim$ (2n−1)th stages are respectively connected to the second input terminals b of the can latch circuits $9_{n+2} \sim 9_{2n}$ of the succeeding stage, respectively.

The control terminals c of all scan latch circuits $9_1 \sim 9_{2n}$ are connected together to receive the control signal C. The input terminals 11 of the first circuit portion $1a$ are respectively connected to the data input terminals $I_1 \sim I_n$. The output terminals 32 of the circuit portion $3a$ are respectively connected to data output terminals $O_1 \sim O_n$.

In the following the operation of the testing circuit will be described.

The operation of the testing circuit can be divided into the operation mode in which the control signal C is at the "L" level, and the shift mode in which the control signal C is at the "H" level.

In the operation mode, all scan latch circuits $9_1 \sim 9_{2n}$ are adapted to take in the signal inputted to first input terminals a. Therefore, the data inputted in parallel from the data input terminals $I_1 \sim I_n$ are inputted to the first circuit portion $1a$, and the data processed in the first circuit portion $1a$ are transferred to the second circuit portion $2a$ through the scan latch circuit $9_1 \sim 9_n$. The data processed in the second circuit portion $2a$ are transferred to the third circuit portion $3a$ through the scan latch circuits $9_{2n} \sim 9_{n+1}$, and the data processed in the circuit portion $3a$ are outputted in parallel from the data output terminals $O_1 \sim O_n$. Namely, in the operation mode, the whole data processing circuit constituted by the circuit portions $1a$, $2a$ and $3a$ carries out normal data processing successively in synchronization with the clock signal $\phi$.

In the shift mode, all scan latch circuits $9_1 \sim 9_{2n}$ are adapted to take in signals inputted to the second input terminals b, so that the scan latch circuits $9_1 \sim 9_{2n}$ constitute one shift register. Therefore, the serial data SI inputted to the second input terminal of the scan latch circuit $9_1$ of the first stage is successively shifted to the scan latch circuits $9_2 \sim 9_{2n}$ of the succeeding stages in synchronization with the clock signal $\phi$ to be outputted from the output terminal d of the scan latch circuit $9_{2n}$ of the last stage as an output data SO. By combining these two operations, the circuit portions can be tested one by one.

In the following, the test of the second circuit portion 2a will be described as an example.

First, the test circuit is set at the shift mode by setting the control signal C at the "H" level. Test data for testing the second circuit portion 2a are serially inputted from the second input terminal b of the scan latch circuit $9_1$ of the first stage to be stored in the scan latch circuits $9_1 \sim 9_n$ of the first to n th stages. Thereafter, by setting the control signal C at "L" level, the test circuit is drawn into the operation mode, and the output data of the test data processed by the second circuit portion 2a are taken in to the scan latch circuits $9_{n+1} \sim 9_{2n}$ of the (n+1)th~2n th stages. Thereafter, the testing circuit is again switched to the shift mode, and the data held in scan latch circuits $9_{n+1} \sim 9_{2n}$ are serially outputted to the outside from the output terminal d of the scan latch circuit $9_{2n}$ of the last stage by shifting operation to verify the data.

In the above described conventional testing circuit, the test data for testing each circuit portion must be serially inputted, and the data processed in each circuit portion must be serially taken out. Therefore, the test requires long periods of time, and it is difficult to prepare the test data.

SUMMARY OF THE INVENTION

An object of the present invention is to provide a circuit having testing function capable of effectively testing each of the circuit portions constituting a data processing circuit regardless of the difference of bit numbers.

Another object of the present invention is to provide a circuit having testing function capable of testing a desired circuit portion independently regardless of the difference of bit numbers between circuit portions constituting the data processing circuit.

A further object of the present invention is to provide a circuit having testing function capable of inputting/outputting test data in parallel to desired circuit portions regardless of the difference of bit numbers between circuit portions constituting the data processing circuit.

A still further object of the present invention is to provide a circuit having testing function outputting tested data in synchronization regardless of the difference of bit numbers between the circuit portions constituting the data processing circuit.

In order to attain the above described objects, the circuit having testing function in accordance with the present invention comprises a plurality of circuit portions, a plurality of testing circuits and a plurality of control means. The plurality of circuit portions constitute a data processing circuit having an operation mode and a test mode, and the number of bits to be pressed in the circuit portion is different from each other. The plurality of testing circuits are provided in correspondence with the plurality of circuit portions. In the operation mode, the plurality of circuit portions function as the data processing circuit, and in the test mode, the testing circuits independently test the corresponding circuit portions and output tested data provided for every processed bit in synchronization. The plurality of control means apply control signals corresponding to the operation mode or the test mode to each of the plurality of testing circuits to activate the testing circuits.

The circuit having testing function structured as described above is capable of effectively testing desired circuit portions irrespective of the difference of the bit numbers of the circuit portions to provide synchronized result of testing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
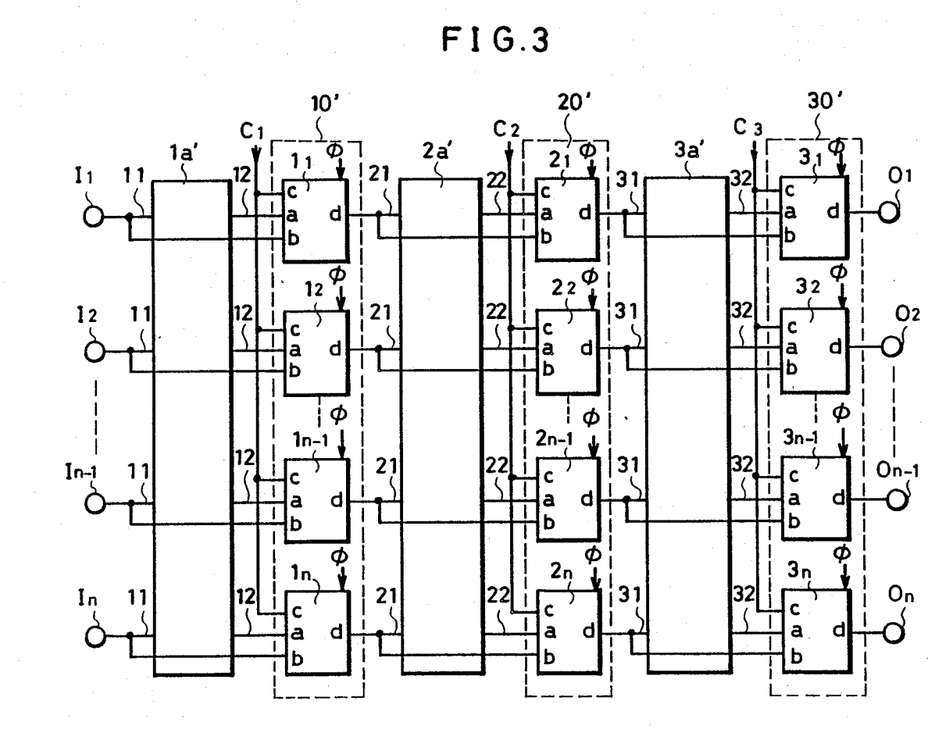
FIG. 3 is a schematic diagram showing an electric circuit having testing function which is the base of the present invention.

FIG. 3 is a schematic diagram showing an electric circuit having testing function which is the basis of the present invention, in which parallel scan register type testing circuits are incorporated in the output side of respective circuit portions for testing each of the circuit portions constituting a prescribed electric circuit.

Referring to the figure, the circuit portion $1a'$, $2a'$ and $3a'$ are formed of combinational logic circuits having n input terminals 11, 21 and 31 and n output terminals 12, 22, 32, respectively.

The testing circuits are formed of three parallel registers $10'$, $20'$, and $30'$ comprising n scan latch circuits $1_1 \sim 1_n$, $2_1 \sim 2_n$, and $3_1 \sim 3_n$, respectively. Each of the scan latch circuits $1_1 \sim 1_n$, $2_1 \sim 2_n$, $3_1 \sim 3_n$ has a first input terminal a, a second input terminal b, a control terminal c and an output terminal d. Either a signal inputted to the first input terminal a or a signal inputted to the second input terminal b is selectively outputted to the output terminal d in accordance with a control signal C ($C_1 \sim C_3$) inputted to the control terminal c.

The function of each of the scan latch circuits $1_1 \sim 1_n$, $2_1 \sim 2_n$, $3_1 \sim 3_n$ is attained by the structure shown in FIG. 2, for example. Namely, when the control signal C is at the "L" level, it takes the signal inputted to the first input terminal a in synchronization with the clock signal $\phi$ to output the same directly and, when the control signal C is at the "H" level, it takes and directly outputs the signal inputted to the second input terminal b in synchronization with the clock signal $\phi$.

The first parallel register $10'$ is arranged on the output side of the first circuit portion $1a'$; the second parallel register $20'$ is arranged on the output side of the second circuit portion $2a'$; and the third parallel register $30'$ is arranged on the output side of the third circuit portion $3a'$.

The n input terminals 11 of the first circuit portion $1a'$ are respectively connected to the data input terminals $I_1 \sim I_n$. The first input terminals a of the scan latch circuits $1_1 \sim 1_n$ constituting the first parallel register 10' are respectively connected to the output terminals 12 of the first circuit portion 1a'. The second input terminals b are respectively connected to the said data input terminals $I_1 \sim I_n$. The output terminals d of the scan latch circuits $1_1 \sim 1_n$ are respectively connected to the input terminals 21 of the second circuit portion 2a'.

In the similar manner, the first input terminals a of the scan latch circuits $2_1 \sim 2_n$ constituting the second parallel register 20' are respectively connected to the output terminals 22 of the second circuit portion 2a'. The second input terminals b are respectively connected to the output terminals d of the scan latch circuits $1_1 \sim 1_n$ constituting the first parallel register 10'. The output terminals d of the scan latch circuits $2_1 \sim 2_n$ are respectively connected to the input terminals 31 of the third circuit portion 3a'.

The first input terminals a of the scan latch circuits $3_1 \sim 3_n$ constituting the third parallel register 30' are respectively connected to the output terminals 32 of the third circuit portion 3a'. The second input terminals b are respectively connected to the output terminals d of the scan latch circuits $2_1 \sim 2_n$ constituting the second parallel register 20'. The output terminals d of the scan latch circuits $3_1 \sim 3_n$ are respectively connected to the data output terminals $O_1 \sim O_n$.

The control terminals c of the scan latch circuits $1_1 \sim 1_n$, $2_1 \sim 2_n$ and $3_1 \sim 3_n$ are connected together in each of the parallel registers 10', 20' and 30' respectively, to receive control signals $C_1$, $C_2$ and $C_3$ independently.

The operation of the electric circuit device having testing function shown in FIG. 3 will be described in the following.

The operation of the electric circuit device having testing function is divided into the operation mode and the test mode.

In the operation mode, the control signals $C_1$, $C_2$ and $C_3$ are all fixed at the "L" level. On this occasion, each of the scan latch circuits $1_1 \sim 1_n$, $2_1 \sim 2_n$ and $3_1 \sim 3_n$ takes the data inputted to the first input terminal a to directly output the same to the output terminal d. The input data applied to the data input terminals $I_1 \sim I_n$ are processed successively in the circuit portions 1a', 2a' and 3a' in accordance with the clock signal to be outputted from the data output terminals $O_1 \sim O_n$. Namely, the whole circuit constituted by the circuit portions 1a' $\sim$ 3a' processes data in synchronization with the clock signal $\phi$, so that the n bit data inputted to the data input terminals $I_1 \sim I_n$ are processed in the circuit portions 1a' $\sim$ 3a' and outputted from the data output terminals $O_1 \sim O_n$ in parallel with each other simultaneously.

In the test mode, one of the control signals $C_1$, $C_2$ and $C_3$ is fixed at the "L" level.

Description will be given of a case in which the second circuit portion 2a' is tested, for example.

The control signals $C_1$ and $C_3$ are set at the "H" level and the control signal $C_2$ is set at the "L" level. On this occasion, the scan latch circuits $1_1 \sim 1_n$ respectively take the data inputted to the second input terminals b to output the same to the output terminals d. Therefore, the n input test data inputted to the data input terminals $I_1 \sim I_n$ are directly inputted to the second circuit portion 2a'. The scan latch circuits $2_1 \sim 2_n$ take the data inputted to the respective first input terminals a to output the same to the output terminals d. Therefore, the data processed in the second circuit portion 2a' are taken by the scan latch circuits $2_1 \sim 2_n$ to be outputted to the output terminals d. In addition, scan latch circuits $3_1 \sim 3_n$ take the data inputted to the second input terminals b to output the same to the output terminals d. Therefore, the data outputted to the output terminals d of the scan latch circuits $2_1 \sim 2_n$ are outputted from the data output terminals $O_1 \sim O_n$.

In this manner, the n bit test data inputted to the data input terminals $I_1 \sim I_n$ are taken by the second circuit portion 2a' through the first parallel register 10'. The test data are processed by the second circuit portion 2a and, thereafter, they are outputted to the data output terminals $O_1 \sim O_n$ through the second parallel register 20' and the third parallel register 30'. Consequently, in the test mode, the structure equivalently comprises a stage of a parallel register in the preceding stage of the second circuit portion 2a' and two stages of parallel registers arranged in series in the succeeding stage. Namely, the circuit portions other than the second circuit portion 2a' do not function in this case. The circuit portion 2a as well as the parallel registers 10' $\sim$ 30' a process data in synchronization with the clock signal $\phi$, so that the n bit data inputted to the data input terminals $I_1 \sim I_n$ are processed in the circuit portion 2a' and thereafter they are outputted in parallel from the data output terminals $O_1 \sim O_n$ simultaneously.

In this electric circuit device having a testing function, the test data can be inputted in parallel only to the desired circuit portion, and the data processed only in that circuit portion can be outputted in parallel. Therefore, each of the circuit portions 1a' $\sim$ 3a' can be independently tested.

However, since the electric circuit device having testing function comprising the parallel scan register type testing circuit is structured as described above, the number of bits of each of the circuit portions constituting the electric circuit must be the same with each other.

Figure 4:
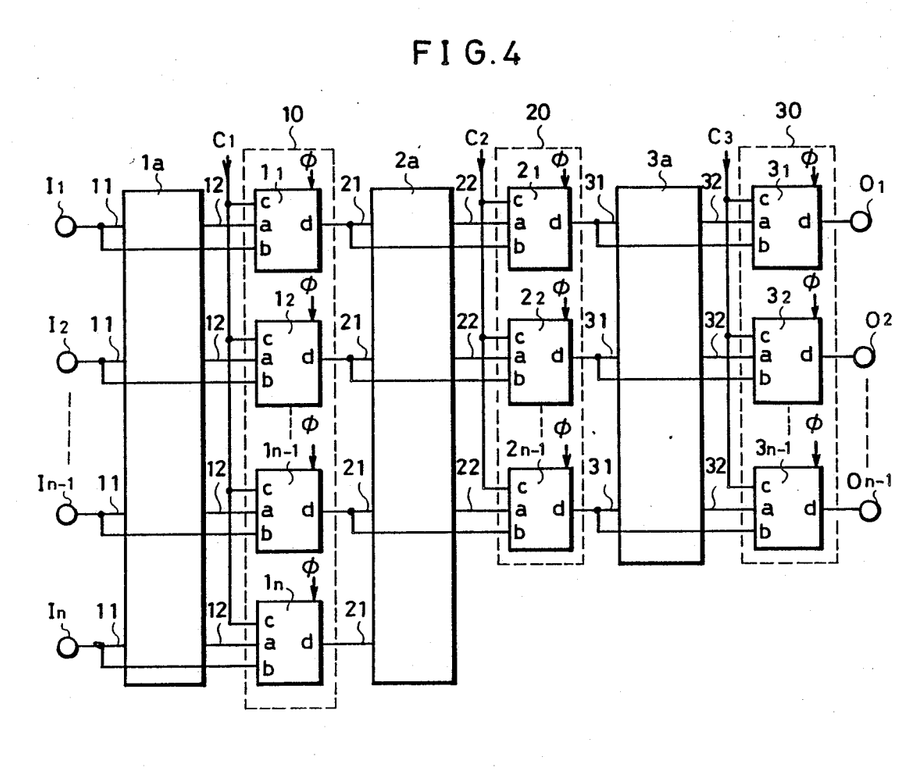
FIG. 4 is a schematic diagram showing an electric circuit in which the number of bits is different in each circuit portion, based on the circuit of FIG. 3.

FIG. 4 is a schematic diagram showing an example of an electric circuit in which the number of bits of the circuit portions is different from each other. Referring to the figure, the number of input terminals 11 and the number of the output terminals 12 are both n bits in the circuit portion 1a; the number of the input terminals 21 is n bits and the number of the output terminals 22 is n−1 bits in the circuit portion 2a; and the number of input terminals 31 and the number of output terminals 32 are both n−1 bits in the circuit portion 3a. Parallel registers 10 $\sim$ 30 are structured in correspondence with the number of bits of the output terminals 12 $\sim$ 32 of respective circuit portions 1a $\sim$ 3a. Namely, the parallel register 10 comprises n scan latch circuits $1_1 \sim 1_n$, and the parallel registers 20 and 30 respectively comprise n−1 scan latch circuits $2_1 \sim 2_{n-1}$ and $3_1 \sim 3_{n-1}$. When this electric circuit is set in the test mode for testing the circuit portion 1a, the output data from that nth bit output terminal 12 in the circuit portion 1a is taken to the scan latch circuit $1_n$, however, it can not be read to the outside. Therefore, the circuit portion 1a can not be independently tested.

Figure 5:
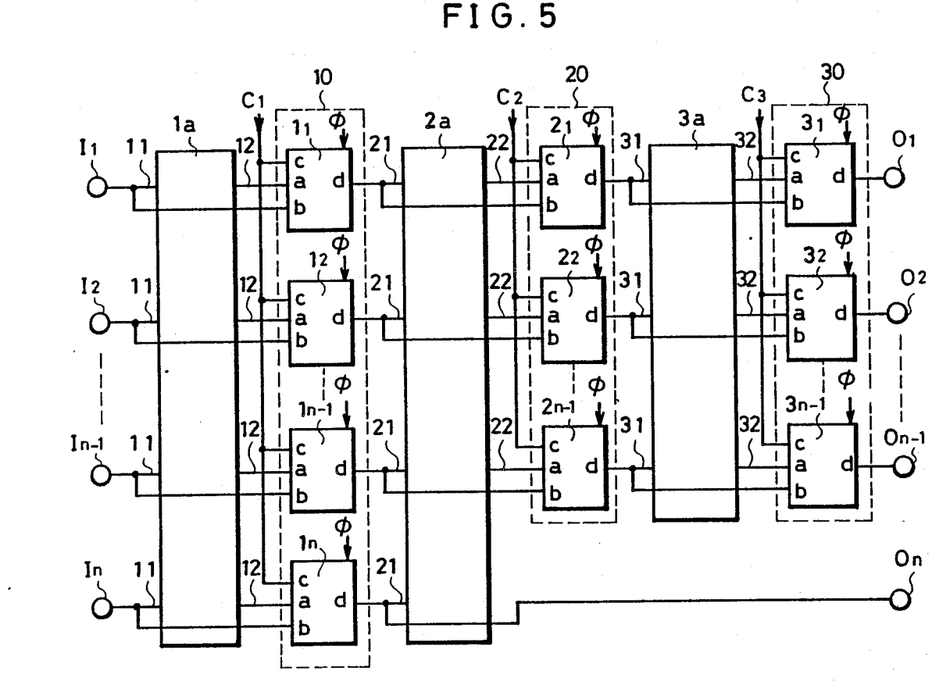
FIG. 5 is a schematic diagram of a modification of FIG. 4.

FIG. 5 is a schematic diagram showing an example of a modification of FIG. 4. Referring to the figure, an nth bit output terminal $O_n$ is provided for reading nth bit output of the circuit portion 1a to the outside, which is connected to the output terminal d of the scan latch circuit $1_n$. Except for this point, the structure is the same as that of FIG. 4. The nth bit data must be simultaneously inputted to the input terminals $I_1 \sim I_n$ in parallel, processed in the circuit portions 1a $\sim$ 3a and in the parallel registers 10~30 in synchronization with the clock signal φ to be simultaneously outputted from the output terminals $O_1 \sim O_n$ in parallel. However, when the output terminal d of the scan latch circuit $1_n$ is directly connected to the nth output terminal $O_n$ as in the above example, the timing of the output of the nth bit data from the output terminal $O_n$ becomes different from the output timing of the data of other bits. Therefore, even if the nth bit output terminal $O_n$ is provided to be connected to the output terminal d of the scan latch circuit $1_n$, correct tested data can not be obtained from the output terminals $O_1 \sim O_n$ in testing the circuit portion 1a.

As described above, in the electric circuit device having testing function such as shown in FIG. 3, there will be some circuit portion which can not be tested when the number of bits of the input terminals or the output terminals of the plurality of circuit portions to be tested are different from each other.

Figure 6:
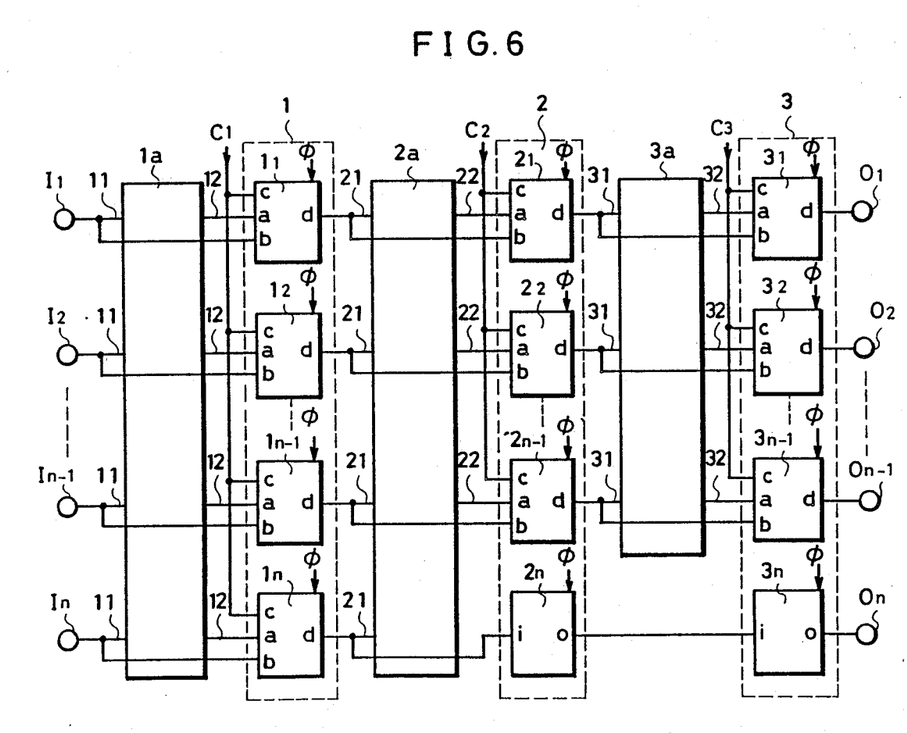
FIG. 6 is a schematic diagram of an electric circuit having testing function in accordance with one embodiment of the present invention.

FIG. 6 is a schematic diagram of an electric circuit having testing function in accordance with one embodiment of the present invention.

Referring to the figure, in order to independently test three circuit portions 1a, 2a and 3a constituting an electric circuit, parallel registers 1~3 are respectively incorporated in the output side of these circuit portions 1a~3a, constituting testing circuits.

Each of the circuit portions 1a, 2a and 3a is formed of a combinational logic circuit. The circuit portion 1a comprises n input terminals 11 and n output terminals 12; the circuit portion 2a comprises n input terminals 21 and n−1 output terminals 22; and the circuit portion 3a comprises n−1 input terminals 31 and n−1 output terminals 32. The structure of each of the circuit portions is the same as that shown in FIG. 4.

The testing circuit is constituted by an n bit parallel register 1 comprising n scan latch circuits $1_1 \sim 1_n$, an n bit parallel register 2 comprising n−1 scan latch circuits $2_1 \sim 2_{n-1}$ and a latch circuit $2_n$, and an n bit parallel register 3 comprising n−1 scan latch circuits $3_1 \sim 3_{n-1}$ and a latch circuit $3_n$.

The structure of each of the scan latch circuits $1_1 \sim 1_n$, $2 \sim 2_{n-1}$ and $3_1 \sim 3_{n-1}$ itself is the same as the scan latch circuit shown in FIGS. 1, 3 and 4. Namely, the function can be attained by the structure shown in FIG. 2 as an example. The latch circuits $2_n$ and $3_n$ are master slave type latch circuits in synchronization with the clock signal φ, and the structure of FIG. 2 with the multiplexer removed is one example of the circuit. Since the scan latch circuits $1_1 \sim 1_n$, $2_1 \sim 2_{n-1}$ and $3_1 \sim 3_{n-1}$ and the latch circuits $2_n$ and $3_n$ are respectively used as unit registers, the parallel registers 1~3 are formed of n unit registers, respectively.

The first parallel register 1 is arranged on the output side of the circuit portion 1a; the second parallel register 2 is arranged on the output side of the circuit portion 2a; and the third parallel register 3 is arranged on the output side of th circuit portion 3a, respectively. A combination of corresponding one circuit portion and one parallel register out of the circuit portions 1a~3a and the parallel registers 1~3 constitutes a set of circuit elements, and the electric circuit which is the object to be tested is constituted by a series connection of three sets of circuit elements.

The n input terminals 11 of the first circuit portion 1a are respectively connected to the data input terminals $I_1 \sim I_n$. The first input terminals a of the scan latch circuits $1_1 \sim 1_n$ constituting the first parallel register 1 are respectively connected to n output terminals 12 of the first circuit portion 1a, and the second input terminals b are respectively connected the said data input terminals $I_1 \sim I_n$. The output terminals d of the scan latch circuits $1_1 \sim 1_n$ are respectively connected to n input terminals 21 of the second circuit portion 2a.

The first input terminals a of the n−1 scan latch circuits $2_1 \sim 2_{n-1}$ constituting the second parallel register 2 are respectively connected to n−1 output terminals 22 of the second circuit portion 2a, and the second terminals b are respectively connected to the output terminals d of the scan latch circuits $1_1 \sim 1_{n-1}$ constituting the first parallel register 1. The input terminal i of the latch circuit $2_n$ is connected to the output terminal d of the scan latch circuit $1_n$.

The first input terminals a of n−1 scan latch circuits $3_1 \sim 3_{n-1}$ constituting the third parallel register 3 are respectively connected to n−1 output terminals 32 of the third circuit portion 3a, and the second input terminals b are respectively connected to the output terminals d of n−1 scan latch circuit $2_1 \sim 2_{n-1}$ constituting the second parallel register 2. The output terminals d of the scan latch circuits $3_1 \sim 3_{n-1}$ are respectively connected to the data output terminals $O_1 \sim O_{n-1}$. The input terminal of the latch circuit $3_n$ is connected to the output terminal o of the latch circuit $2_n$, and the output terminal o of the latch circuit $3_n$ is connected to the data output terminal $O_n$.

Namely, in this embodiment, each of the parallel registers 1~3 comprises a plurality of unit registers whose number corresponds to the maximum bit number (n) of respective number of bits to be processed in each of the circuit portions 1a~3a. As for the unit register (latch circuit) $3_n$, for example, having no output bit applied from the corresponding circuit portions 3a, only the output of the unit register $2_n$ of the preceding stage is applied as the data input i to the unit register $3_n$. As for the unit register $2_n$, for example, whose output can not be received by the input portion of the circuit portion 3a in the succeeding stage, only the output of the said unit register $2_n$ is outputted to the corresponding unit register $3_n$ in the parallel register 3 in the succeeding stage.

The control terminals c of the scan latch circuits $1_1 \sim 1_n$, $2_1 \sim 2_n$ and $3_1 \sim 3_{n-1}$ are connected together in each of the parallel register 1, 2 and 3 respectively to receive control signals $C_1$, $C_2$ and $C_3$, independently.

The operation of the electric circuit device having testing function shown in FIG. 6 will be described in the following.

The operation of the electric circuit device having the testing function in accordance with this embodiment can be divided into the operation mode and the test mode as in the conventional electric circuit device having the testing function or in the device which is the base of the present invention.

In the operation mode, all control signals $C_1$, $C_2$ and $C_3$ are fixed at the "L" level. On this occasion, since the scan latch circuits $1_1 \sim 1_n$, $2_1 \sim 2_{n-1}$ and $3_1 \sim 3_{n-1}$ respectively take the data input to the first input terminals a to output the same directly to the output terminals d, the input data applied to the input terminals $I_1 \sim I_n$ are successively processed in the circuit portions 1a, 2a and 3a to be outputted from the data output terminals $O_1 \sim O_{n-1}$. Namely, the whole circuit constituted by the circuit portions 1a, 2a and 3a successively processes data in synchronization with the clock signal φ, not shown. On this occasion, the data outputted from the nth bit output terminal 12 of the circuit portion 1a is inputted to the circuit portion 2a and at the same time, outputted from the data output terminal $O_n$ through latch circuits $2_n$ and $3_n$. In the operation mode, the data outputted from the output terminal $O_n$ is neglected.

In the test mode, one of the control signals $C_1$, $C_2$ and $C_3$ is set at the "L" level, and other control signals are set at the "H" level.

In the following, description will be given of a case in which the first circuit portion 1a is tested, for example.

The control signal $C_1$ is set at the "L" level and the control signals $C_2$ and $C_3$ are set at "H" level. On this occasion, the n bit data inputted to the data input terminals $I_1 18 I_n$ are processed in the circuit portion 1a, and the scan latch circuit $1_1 \sim 1_n$ take n bit data inputted to the first input terminals a, that is, the n bit processed data outputted from the circuit portion 1a, to output the same to the output terminals d. The scan latch circuits $2_1 \sim 2_{n-1}$ and $3_1 \sim 3_{n-1}$ take the data inputted to the second input terminals b to output the same to the output terminals d. Namely, the data outputted from the output terminals d of the scan latch circuits $1_1 \sim 1_{n-1}$ bypass the circuit portions 2a and 3a and are outputted to the data output terminals $O_1 \sim O_{n-1}$ only through the scan latch circuits $2_1 \sim 2_{n-1}$ and $3_1 \sim 3_{n-1}$. In addition, the data outputted from the output terminal d of the scan latch circuit $1_n$ bypasses the circuit portion 2a and is outputted to the data output terminal of $O_n$ through the latch circuits $2_n$ and $3_n$.

Therefore, in this test mode, the structure equivalently comprises three stages of parallel registers arranged in series in the succeeding stage of the first circuit portion 1a. The first circuit portion 1a and the parallel registers 1~3 process data bit by bit in synchronization with the clock signal $\phi$, whereby the n bit data simultaneously inputted in parallel to the data input terminals $I_1 \sim I_n$ are processed in the first circuit portion 1a and thereafter outputted simultaneously from the output terminals $O_1 \sim O_n$ in parallel. Therefore, the first circuit portion 1a can be independently tested.

When the second circuit portion 2a should be tested, the control signal $C_2$ is set at the "L" level and the control signals $C_1$ and $C_3$ are set at "H" level. On this occasion, the n bit input data applied to the input terminals $I_1 \sim I_n$ bypass the circuit portion 1a to be taken to the scan latch circuits $1_1 \sim 1_n$, and they are directly outputted from respective output terminals d. Thereafter, the input data are processed in the circuit portion 2a and n−1 bit output data are respectively applied from the output terminals 22 to the scan latch circuits $2_1 \sim 2_{n-1}$. The n−1 bit output data bypass the circuit portion 3a and are outputted to the data output terminals $O_1 \sim O_{n-1}$ through the scan latch circuits $3_1 \sim 3_{n-1}$. The data inputted to the nth bit data input terminal $I_n$ is outputted through the scan latch circuit $1_n$ and the latch circuits $2_n$ and $3_n$ to be outputted from the data output terminal $O_n$. Since this data is unnecessary as the test data for the circuit portion 2a, it is neglected.

In this manner, in the test mode, the structure comprises one stage of a parallel register in the preceding stage of the second circuit portion 2a and two stages of parallel registers arranged in series in the succeeding stage thereof. Both the second circuit portion 2a and parallel registers 1~3 process data in synchronization with the clock signal $\phi$. Consequently, the n bit data simultaneously inputted to the data input terminals $I_1 18 I_n$ in partial circuit portion 2a and thereafter, simultaneously outputted from the output terminals $O_1 \sim O_{n-1}$ in parallel as n−1 bit output data. Therefore, the second circuit portion 2a can be independently tested.

In testing the third circuit portion 3a, the control signal $C_3$ is set at the "L" level and the control signals $C_1$ and $C_2$ are set at the "H" level, whereby it can be independently tested in the similar manner as described above.

Although each of the circuit portions 1a, 2a and 3a is formed of a combinational logic circuit in the above embodiment, it is not limited to this and any circuit may be applied, such as a circuit of pipeline structure operating in synchronization with the clock signal.

Although a simple structure having three circuit portions and only two different bit numbers n and (n−1) is shown in the above example, the number of the circuit portions and the number of bits are not limited to those mentioned.

Scan latch circuits $2_n'$ and $3_n'$ which are the same as other scan circuits $1_1 \sim 1_n$, $2_1 \sim 2_{n-1}$ and $3_1 \sim 3_{n-1}$ may be used as the latch circuits $2_n$ and $3_n$. In that case, the output terminal d of the scan latch circuit $1_n$ (or $2_n'$) of the preceding stage should be connected commonly to the first and second input terminals a and b of the scan latch circuit $2_n'$ (or $3_n'$). By doing so, the output of the output terminal d of the scan latch circuit $2_n'$ or $(3_n')$ will be always the same as the data outputted from the scan latch circuit $1_n$ (or $2_n'$) of the preceding stage, irrespective of the control signal $C_2$ (or $C_3$) applied to the control terminal c.

Although the present invention has ben described and illustrated in detail, it is clearly understood that the same is by way of illustration and example only and is not to be taken by way of limitation, the spirit and scope of the present invention being limited only by the terms of the appended claims.

What is claimed is:

1. A circuit having a testing function, comprising:
   a plurality of circuit portions constituting a data processing circuit having an operation mode and a test mode, each having different number of bits to be processed therein:
   a plurality of testing circuits, each having an independent input, provided corresponding to said plurality of circuit portions,
   each of said plurality of testing circuits being interposed between an output of one of said circuit portions corresponding to said testing circuit and an input of another of said circuit portions each of said plurality of testing circuits having an additional input connected to a respective input of said circuit portion corresponding to said testing circuit,
   whereby, responsive to signals on said independent inputs of said testing circuits, said plurality of circuit portions are made to function as said data processing circuit in said operation mode, and are selectively isolated or bypassed for testing the corresponding circuit portion to output test data obtained from each processed bit in synchronization in said test mode.

2. A circuit having testing function according to claim 1, wherein
   each of said plurality of circuit portions comprises one or more input terminals (11~31) and one or more output terminals (12~32);
   each of said plurality of testing circuits comprises one or more scan latch circuits, the number of which is equal to the number of the output terminals of the corresponding circuit portion, and, additionally, when the number of the output terminals of the corresponding circuit portion is not equal to the number of the output terminals of the circuit portion having maximum number of bits to be processed, one or more latch circuits, the number of which is equal to the difference between the number of output terminals and the maximum number of bit to be processed.

3. A circuit having testing function according to claim 2, wherein a plurality of sets of circuit elements are constituted by said plurality of circuit portions and the corresponding testing circuits, said circuit elements being connected in series with each other.

4. A circuit having testing function according to claim 3, wherein said scan latch circuits and said latch circuits correspond to respective bits to be processed in said plurality of circuit portions, the scan latch circuit of one circuit element comprising a first input terminal, a second input terminal, a control terminal and a scan output terminal, and the latch circuit of said one circuit element comprising a latch input terminal and a latch output terminal;

said first input terminal connected to the output terminal of the corresponding circuit portion, said second input terminal connected to the input terminal of the corresponding circuit portion or to the scan output terminal of the scan latch circuit and the latch output terminal of the latch circuit in a testing circuit corresponding to the circuit element preceding said one circuit being inputted to said control signal being inputted to said control terminal, and said scan output terminal connected to the input terminal of the circuit portion of a succeeding circuit element to which said one circuit element is connected, to the second input terminal of the scan latch circuit or to the input terminal of the latch circuit in the circuit element of said succeeding circuit element; and said latch input terminal connected to the scan output terminal of the scan latch circuit or the latch output terminal of the latch circuit in the circuit element of said preceding stage, and said latch output terminal connected to the input terminal of the circuit portion of the circuit element of said succeeding stage, to the second input terminal of the scan latch circuit or to the latch input terminal of the latch circuit in the testing circuit.

5. A circuit having testing function according to claim 4, wherein said control signal comprises a first signal state defining the operation mode and a second signal state defining the test mode, said first input terminal and said scan output terminal are electrically conducted by the application of said control signal of said first state to said control terminal, and said second input terminal and scan output terminal are electrically conducted by the application of said control signal of said second signal state to said control terminal.

6. A circuit having testing function according to claim 4, comprising data input terminals whose number being equal to said maximum number of bits to be processed, to which data to be processed or data for testing are inputted; and data output terminals whose number being equal to that of said data input terminals from which processed data or tested data are outputted;

each of said data input terminals connected to each of the input terminals of the circuit portion and to each of the second input terminals or each of the scan input terminals of the testing circuit of one circuit element, each of said data output terminals connected to each of the scan output terminals of the scan latch circuit and each of the latch output terminal of the latch circuit of the test circuit in another circuit element.

7. A circuit having testing function according to claim 2, wherein scan circuits and the latch circuits included in each of said plurality of testing circuits synchronously output data.

8. A circuit having testing function according to claim 7, wherein synchronized clock signals are applied to the scan latch circuit and the latch circuit included in each of said plurality of testing circuits.

9. A circuit having testing function, comprising:

a plurality of circuit portions constituting a data processing circuit having an operation mode and a test mode;

a plurality of testing means each having independent inputs provided corresponding to said plurality of circuit portions, for making said plurality of circuit portions function as said data processing circuit in said operation mode and testing corresponding circuit portions independently in said test mode by concurrently bypassing at least another said circuit portion in said test mode, whereby, responsive to signals on said independent inputs of said testing circuits, said plurality of circuit portions are made to function as said data processing circuit in said operation mode, and are selectively isolated or bypassed for testing the corresponding circuit portion to output test data obtained from each processed bit in synchronization in said test mode.

* * * * *